United States Patent
Kajiwara et al.

(10) Patent No.: US 10,935,881 B2
(45) Date of Patent: *Mar. 2, 2021

(54) MASK BLANK, PHASE SHIFT MASK, PHASE SHIFT MASK MANUFACTURING METHOD, AND SEMICONDUCTOR DEVICE MANUFACTURING METHOD

(71) Applicant: HOYA CORPORATION, Tokyo (JP)

(72) Inventors: Takenori Kajiwara, Tokyo (JP); Hiroaki Shishido, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 71 days.

This patent is subject to a terminal disclaimer.

(21) Appl. No.: 15/743,783

(22) PCT Filed: Jul. 11, 2016

(86) PCT No.: PCT/JP2016/070405
§ 371 (c)(1),
(2) Date: Jan. 11, 2018

(87) PCT Pub. No.: WO2017/010452
PCT Pub. Date: Jan. 19, 2017

(65) Prior Publication Data
US 2018/0210331 A1    Jul. 26, 2018

(30) Foreign Application Priority Data
Jul. 15, 2015  (JP) .............................. JP2015-141317

(51) Int. Cl.
| | |
|---|---|
| G03F 1/32 | (2012.01) |
| G03F 1/54 | (2012.01) |
| G03F 1/58 | (2012.01) |
| G03F 1/80 | (2012.01) |
| G03F 1/82 | (2012.01) |
| H01L 21/033 | (2006.01) |

(52) U.S. Cl.
CPC .................. *G03F 1/32* (2013.01); *G03F 1/54* (2013.01); *G03F 1/58* (2013.01); *G03F 1/80* (2013.01); *G03F 1/82* (2013.01); *H01L 21/0337* (2013.01)

(58) Field of Classification Search
CPC .................. G03F 1/32; G03F 1/26; G03F 1/54
See application file for complete search history.

(56) References Cited

U.S. PATENT DOCUMENTS

| | | | |
|---|---|---|---|
| 5,938,897 A | 8/1999 | Isao et al. | |
| 6,569,577 B1 | 5/2003 | Isao et al. | |
| 9,256,119 B2* | 2/2016 | Nam | G03F 1/26 |
| 9,625,806 B2* | 4/2017 | Nozawa | G03F 1/32 |
| 10,114,281 B2* | 10/2018 | Nozawa | G03F 1/26 |
| 10,146,123 B2* | 12/2018 | Shishido | C23C 14/0641 |
| 10,180,622 B2* | 1/2019 | Shishido | G03F 1/26 |
| 10,365,556 B2* | 7/2019 | Shishido | C23C 14/06 |
| 10,481,486 B2* | 11/2019 | Nozawa | G03F 1/32 |
| 10,539,866 B2* | 1/2020 | Nozawa | H01L 21/0275 |
| 10,551,734 B2* | 2/2020 | Shishido | C23C 14/3464 |
| 10,606,164 B2* | 3/2020 | Nozawa | C23C 14/06 |
| 2011/0081605 A1 | 4/2011 | Iwashita et al. | |
| 2016/0059272 A1* | 3/2016 | Cheng | H01L 21/02041 134/4 |
| 2017/0285458 A1 | 10/2017 | Shishido et al. | |

FOREIGN PATENT DOCUMENTS

| | | |
|---|---|---|
| JP | H08-74031 A | 3/1996 |
| JP | 2001-201842 A | 7/2001 |
| JP | 2006-184355 A | 7/2006 |
| JP | 2009-162851 A | 7/2009 |
| JP | 2014-145920 A | 8/2014 |
| WO | 2009/123166 A1 | 10/2009 |
| WO | 2016/103843 A1 | 6/2016 |

OTHER PUBLICATIONS

Sep. 20, 2016 International Search Report issued in International Patent Application No. PCT/JP2016/070405.

* cited by examiner

*Primary Examiner* — Daborah Chacko-Davis
(74) *Attorney, Agent, or Firm* — Oliff PLC

(57) ABSTRACT

An object is to provide a mask blank for manufacturing a phase shift mask in which a thermal expansion of a phase shift pattern, which is caused when exposure light is radiated onto the phase shift pattern, and displacement of the phase shift pattern are suppressed to be small. A phase shift film has a function of transmitting exposure light from an ArF excimer laser at a transmittance of 2% or higher and 30% or lower and a function of generating a phase difference of 150° or larger and 180° or smaller between the exposure light that has been transmitted through the phase shift film and the exposure light that has passed through air by a distance equal to a thickness of the phase shift film. The phase shift film is formed of a material containing a metal and silicon, and has a structure in which a lower layer and an upper layer are laminated in the stated order from a transparent substrate side. The lower layer has a refractive index n at a wavelength of the exposure light that is smaller than that of the transparent substrate. The upper layer has a refractive index n at the wavelength of the exposure light that is larger than that of the transparent substrate. The lower layer has an extinction coefficient k at the wavelength of the exposure light that is larger than that of the upper layer. The upper layer has a thickness that is larger than that of the lower layer.

28 Claims, 2 Drawing Sheets

MASK BLANK, PHASE SHIFT MASK, PHASE SHIFT MASK MANUFACTURING METHOD, AND SEMICONDUCTOR DEVICE MANUFACTURING METHOD

TECHNICAL FIELD

This invention relates to a mask blank, a phase shift mask manufactured using the mask blank, and a method of manufacturing the phase shift mask. This invention also relates to a method of manufacturing a semiconductor device using the above-mentioned phase shift mask.

BACKGROUND ART

In general, in a manufacturing process for a semiconductor device, a fine pattern is formed using a photolithography method. Further, in forming the fine pattern, a large number of substrates, which are called transfer masks, are generally used. In forming a finer pattern of the semiconductor device, in addition to forming a finer mask pattern in a transfer mask, there is a need to use an exposure light source having a shorter wavelength in photolithography. In recent years, the wavelength of the exposure light source used in manufacturing the semiconductor device has become shorter from KrF excimer laser (wavelength: 248 nm) to ArF excimer laser (wavelength: 193 nm).

As types of the transfer mask, in addition to a related-art binary mask including a light shielding pattern made of a chromium-based material on a transparent substrate, a halftone-type phase shift mask is known. For a phase shift film of the halftone-type phase shift mask, a molybdenum silicide (MoSi)-based material is widely used. Patent Document 1 discloses a halftone-type phase shift mask blank including a semi-light-transmitting film, which contains a metal, silicon, and nitrogen as main components, and includes a surface layer having 35 atomic % or larger as an oxygen content and 5 atomic % or smaller as a metal content.

In Patent Document 2, there is a description that, along with formation of a finer pattern of a reticle (transfer mask), the influence of deformation of the pattern due to thermal expansion of the pattern of the transfer mask, which is caused by radiation of exposure light, becomes non-negligible. Patent Document 2 discloses that the reticle is provided with a structure including, between a light shielding film and a glass blank, a reflective film having a reflectance (back-surface reflectance) with respect to the exposure light that is higher than that of the light shielding film, so as to reduce the thermal expansion of the pattern. Further, there is a disclosure that the reticle structure described above is applicable to a halftone reticle and a phase shift reticle.

PRIOR ART DOCUMENTS

Patent Document

Patent Document 1: JP 2006-184355 A
Patent Document 2: JP 2009-162851 A

SUMMARY OF THE INVENTION

Problem to be Solved by the Invention

The phase shift film of the halftone-type phase shift mask (hereinafter referred to simply as "phase shift film" and "phase shift mask", respectively) is required to have both a function of transmitting the exposure light therethrough at a predetermined transmittance and a function of generating a predetermined phase difference between the exposure light that has been transmitted through the phase shift film and the exposure light that has passed through air by a distance equal to a thickness of the phase shift film. The phase shift film has a transmittance that is significantly higher than that of the light shielding film of the related-art binary mask, and causes smaller thermal expansion of a thin-film pattern through conversion of the exposure light absorbed by the thin-film pattern into heat than thermal expansion of the light shielding film. In recent years, semiconductor devices have been further downsized, and hence the application of a light exposure technology, for example, a multiple patterning technology, has been started. Thus, requirements for overlay accuracy between transfer masks included in a transfer mask set, which is used to manufacture a single semiconductor device, have become severer. Therefore, even in a case of the phase shift mask, there has been a growing demand for suppression of the thermal expansion of the pattern (phase shift pattern) of the phase shift film to suppress displacement of the phase shift pattern due to the thermal expansion.

In a case of a laminate structure of the reflective film and the light shielding film, which corresponds to a configuration disclosed in Patent Document 2, the reflective film is formed of a multi-layered film so as to achieve a high back-surface reflectance of 60% or higher. Specifically, there is disclosed the reflective film having a seven-layer structure composed of an aluminum layer, a silicon oxide layer, a molybdenum layer, an aluminum layer, a silicon oxide layer, a molybdenum layer, and an aluminum layer from a substrate side. The seven-layer structure portion of the reflective film greatly contributes to the high back-surface reflectance of the laminate structure of the reflective film and the light shielding film. However, although it is relatively easy to apply the laminate structure of the reflective film and the light shielding film to the light shielding film for the binary mask, it is difficult to apply the laminate structure to the phase shift film. The light shielding film for the binary mask basically only needs to satisfy a condition of a predetermined optical density or higher with respect to the exposure light. Meanwhile, the phase shift film is required to simultaneously satisfy two conditions, that is, a predetermined range of transmittance with respect to the exposure light and a predetermined range of phase difference. When the above-mentioned reflective film having the seven-layer structure is provided on the substrate side of the phase shift film, the transmittance of the exposure light transmitted through the reflective film and the phase difference provided to the exposure light transmitted through the reflective film greatly affect the whole phase shift film. Thus, a degree of freedom in optical design of the phase shift film excluding the reflective film is greatly restricted.

Meanwhile, a bias associated with an electro magnetics field (EMF) effect is desired to be small in the mask blank for manufacturing the transfer mask. As one of effective methods for reducing the EMF bias, a method for reducing a thickness of a thin-film pattern of the transfer mask can be given. When the above-mentioned reflective film having the seven-layer structure is provided on the substrate side of the thin-film pattern, a total thickness of the thin-film pattern inevitably becomes significantly larger (exceeds 100 nm) than that in a case where the reflective film is not provided.

Hitherto, the phase shift film is formed of a material containing a metal, silicon, and nitrogen as main components in many cases. This is because the material of the phase shift film tends to have optical characteristics being a relatively high refractive index n and a relatively low extinction coefficient k, and therefore the phase shift film is relatively easy to adjust so as to have the predetermined phase difference and the predetermined transmittance. When the phase shift film made of the material described above is formed in contact with a surface of the substrate, however, it is difficult to increase the back-surface reflectance with respect to the exposure light (less than 20%).

In view of the foregoing, this invention has been made to solve the related-art problems, and has an object to provide a mask blank including a phase shift film on a transparent substrate, the phase shift film with a relatively small thickness having all of a function of transmitting exposure light at a predetermined transmittance, a function of generating a predetermined phase difference with respect to the exposure light transmitted through the phase shift film, and a function of increasing a back-surface reflectance with respect to the exposure light. This invention has another object to provide a phase shift mask manufactured using the mask blank. In addition, this invention has a further object to provide a method of manufacturing the phase shift mask. This invention also has a still further object to provide a method of manufacturing a semiconductor device, which uses the phase shift mask.

Means to Solve the Problem

In order to achieve the objects described above, this invention has the following configurations.

(Structure 1)

A mask blank, comprising a phase shift film on a transparent substrate, the phase shift film having a function of transmitting exposure light from an ArF excimer laser at a transmittance of 2% or higher and 30% or lower and a function of generating a phase difference of 150° or larger and 180° or smaller between the exposure light that has been transmitted through the phase shift film and the exposure light that has passed through air by a distance equal to a thickness of the phase shift film, the phase shift film being formed of a material containing a metal and silicon and having a structure in which a lower layer and an upper layer are laminated in the stated order from the transparent substrate side, the lower layer having a refractive index n at a wavelength of the exposure light that is smaller than a refractive index n at the wavelength of the exposure light of the transparent substrate, the upper layer having a refractive index n at the wavelength of the exposure light that is larger than the refractive index n at the wavelength of the exposure light of the transparent substrate, the lower layer having an extinction coefficient k at the wavelength of the exposure light that is larger than an extinction coefficient k at the wavelength of the exposure light of the upper layer, the upper layer having a thickness that is larger than a thickness of the lower layer.

(Structure 2)

A mask blank according to structure 1, wherein the thickness of the lower layer is smaller than 10 nm.

(Structure 3)

A mask blank according to structure 1 or 2, wherein the thickness of the upper layer is 9 times or more larger than the thickness of the lower layer.

(Structure 4)

A mask blank according to any one of structures 1 to 3, wherein the refractive index n of the lower layer is 1.5 or smaller.

(Structure 5)

A mask blank according to any one of structures 1 to 4, wherein the refractive index n of the upper layer is 2.0 or larger.

(Structure 6)

A mask blank according to any one of structures 1 to 5, wherein the extinction coefficient k of the lower layer is 2.0 or larger.

(Structure 7)

A mask blank according to any one of structures 1 to 6, wherein the extinction coefficient k of the upper layer is 0.8 or smaller.

(Structure 8)

A mask blank according to any one of structures 1 to 7, wherein the lower layer is formed of a material containing a metal and silicon, the material being substantially free from oxygen, and wherein the upper layer is formed of a material containing a metal, silicon, nitrogen, and oxygen.

(Structure 9)

A mask blank according to any one of structures 1 to 8, wherein the mask blank has a back-surface reflectance of 20% or higher and 45% or lower with respect to the exposure light entering the mask blank from the transparent substrate side.

(Structure 10)

A mask blank according to any one of structures 1 to 9, wherein the lower layer is formed in contact with a surface of the transparent substrate.

(Structure 11)

A mask blank according to any one of structures 1 to 10, wherein the phase shift film has a thickness that is smaller than 100 nm.

(Structure 12)

A mask blank according to any one of structures 1 to 11, wherein the upper layer has, as a surface layer, a layer having an oxygen content that is larger than an oxygen content of the upper layer excluding the surface layer.

(Structure 13)

A mask blank according to any one of structures 1 to 12, further comprises a light shielding film formed on the phase shift film.

(Structure 14)

14. A phase shift mask, comprising a phase shift film having a transfer pattern formed therein, on a transparent substrate, the phase shift film having a function of transmitting exposure light from an ArF excimer laser at a transmittance of 2% or higher and 30% or lower and a function of generating a phase difference of 150° or larger and 180° or smaller between the exposure light that has been transmitted through the phase shift film and the exposure light that has passed through air by a distance equal to a thickness of the phase shift film, the phase shift film being formed of a material containing a metal and silicon and having a structure in which a lower layer and an upper layer are laminated in the stated order from the transparent substrate side, the lower layer having a refractive index n at a wavelength of the exposure light that is smaller than a refractive index n at the wavelength of the exposure light of the transparent substrate, the upper layer having a refractive index n at the wavelength of the exposure light that is larger than the refractive index n at the wavelength of the exposure light of the transparent substrate, the lower layer having an extinction coefficient k at the wavelength of the exposure light that is larger than an extinction coefficient k at the wavelength of the exposure light of the upper layer, the upper layer having a thickness that is larger than a thickness of the lower layer.

(Structure 15)

A phase shift mask according to structure 14, wherein the thickness of the lower layer is smaller than 10 nm.

(Structure 16)

A phase shift mask according to structure 14 or 15, wherein the thickness of the upper layer is 9 times or more larger than the thickness of the lower layer.

(Structure 17)

A phase shift mask according to any one of structures 14 to 16, wherein the refractive index n of the lower layer is 1.5 or smaller.

(Structure 18)

A phase shift mask according to any one of structures 14 to 17, wherein the refractive index n of the upper layer is 2.0 or larger.

(Structure 19)

A phase shift mask according to any one of structures 14 to 18, wherein the extinction coefficient k of the lower layer is 2.0 or larger.

(Structure 20)

A phase shift mask according to any one of structures 14 to 19, wherein the extinction coefficient k of the upper layer is 0.8 or smaller.

(Structure 21)

A phase shift mask according to any one of structures 14 to 20, wherein the lower layer is formed of a material containing a metal and silicon, the material being substantially free from oxygen, and wherein the upper layer is formed of a material containing a metal, silicon, nitrogen, and oxygen.

(Structure 22)

A phase shift mask according to any one of structures 14 to 21, wherein the phase shift mask has a back-surface reflectance of 20% or higher and 45% or lower with respect to the exposure light entering the phase shift mask from the transparent substrate side.

(Structure 23)

A phase shift mask according to any one of structures 14 to 22, wherein the lower layer is formed in contact with a surface of the transparent substrate.

(Structure 24)

A phase shift mask according to any one of structures 14 to 23, wherein the phase shift film has a thickness that is smaller than 100 nm.

(Structure 25)

A phase shift mask according to any one of structures 14 to 24, wherein the upper layer has, as a surface layer, a layer having an oxygen content that is larger than an oxygen content of the upper layer excluding the surface layer.

(Structure 26)

A method of manufacturing a phase shift mask using the mask blank of structure 13, the method comprising the steps of:

forming a transfer pattern in the light shielding film by dry etching;

forming a transfer pattern in the phase shift film by dry etching using the light shielding film having the transfer pattern as a mask; and forming a light shielding band pattern in the light shielding film by dry etching using a resist film having the light shielding band pattern as a mask.

(Structure 27)

A method of manufacturing a semiconductor device, comprising a step of transferring a transfer pattern onto a resist film on a semiconductor device through light exposure through use of the phase shift mask of any one of structures 14 to 25.

(Structure 28)

A method of manufacturing a semiconductor device, comprising a step of transferring a transfer pattern onto a resist film on a semiconductor device through light exposure through use of the phase shift mask manufactured by the method of manufacturing a phase shift mask of structure 26.

Effect of the Invention

The mask blank according to this invention includes the phase shift film with a relatively small thickness (smaller than 100 nm), which can have all of the function of transmitting the exposure light at the predetermined transmittance, the function of generating the predetermined phase difference with respect to the exposure light transmitted through the phase shift film, and the function of increasing the back-surface reflectance with respect to the exposure light. In this manner, thermal expansion of a phase shift pattern of the phase shift mask manufactured with the mask blank, which occurs when the exposure light is radiated on the phase shift pattern, can be reduced. Thus, displacement of the phase shift pattern can be suppressed.

MODES FOR EMBODYING THE INVENTION

Figure 1:
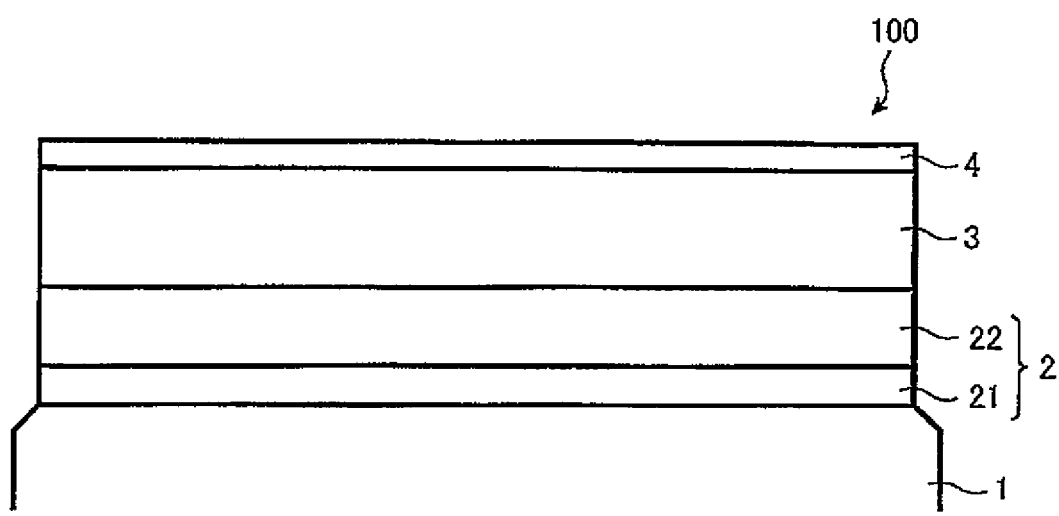
FIG. 1 is a sectional view for illustrating a configuration of a mask blank according to an embodiment of this invention.

Now, each embodiment of this invention is described.

With regard to a mask blank for manufacturing a phase shift mask, the inventors of this invention have extensively examined a configuration required for a phase shift film of the mask blank, which has a relatively small thickness (smaller than 100 nm), to have all of a function of transmitting exposure light at a predetermined transmittance (2% or higher and 30% or lower), a function of generating a predetermined phase difference (150° or larger and 180° or smaller) with respect to the exposure light transmitted through the phase shift film, and a function of increasing a back-surface reflectance (20% or higher) with respect to the exposure light.

In order to increase a back-surface reflectance of a thin film formed on a transparent substrate, at least a layer included in the thin film, which is in contact with the transparent substrate, is required to be formed of a material having a large extinction coefficient k at an exposure wavelength. A phase shift film having a single-layer structure is generally formed of a material having a large refractive index n and a small extinction coefficient k because of the need to achieve required optical characteristics and film thickness. Here, it is considered to adjust a composition of the material for forming the phase shift film to significantly increase the extinction coefficient k so as to increase the back-surface reflectance of the phase shift film. When the above-mentioned adjustment is performed, the phase shift film cannot satisfy the condition of the predetermined range of transmittance. Therefore, the thickness of the phase shift film is required to be significantly reduced. In turn, however, the phase shift film cannot satisfy the condition of the predetermined range of phase difference due to the reduced thickness of the phase shift film. An increase in the refractive index n of the material for forming the phase shift film has a limitation. Therefore, it is difficult to increase the back-surface reflectance with the phase shift film in the single layer.

Meanwhile, when a reflective film having a multi-layer structure is provided on the transparent substrate side of the phase shift film in order to increase the back-surface reflectance as described above, there are a problem of a significantly increased total thickness of the phase shift film and a problem of difficulty in adjustment for satisfying the condition of the predetermined range of transmittance and the condition of the predetermined range of phase difference. Therefore, further examinations have been conducted based not on a design idea that the back-surface reflectance is increased only with the reflective film as in the case of using a reflective film having a seven-layer structure but on a design idea that the phase shift film has a laminate structure including a lower layer and an upper layer so that the back-surface reflectance is increased as the whole laminate structure.

For the upper layer included in the phase shift film, which is positioned on a side farther from the transparent substrate, it is determined to use a material having the large refractive index n and the small extinction coefficient k as in the case of the related-art single-layer phase shift film. On the other hand, for the lower layer included in the phase shift film, which is positioned on the transparent substrate side, it is determined to use a material having the extinction coefficient k larger than that of the related-art phase shift film. The lower layer described above functions to reduce the transmittance of the phase shift film. In consideration of this fact, a thickness of the lower layer is set at least smaller than a thickness of the upper layer. When the thickness of the lower layer is reduced, a light amount of the exposure light transmitted through the lower layer increases, and hence the back-surface reflectance is reduced. Therefore, in order to further increase the back-surface reflectance, it is determined to set the refractive index n of the material for forming the lower layer smaller than the refractive index n of the transparent substrate. In this manner, a difference in the refractive index n between the lower layer and the upper layer increases to increase a reflected light amount of the exposure light at an interface between the lower layer and the upper layer. Thus, the back-surface reflectance of the phase shift film can be increased.

Materials containing a metal and silicon are suitable as materials for forming the upper layer and the lower layer of the phase shift film described above. Those materials can achieve the refractive index n and the extinction coefficient k that are required for the upper layer and the refractive index n and the extinction coefficient k that are required for the lower layer by adjusting compositions thereof and other factors. The inventors of this invention have reached the conclusion that the above-mentioned technical problems can be solved by achieving the configuration of the phase shift film described above.

Specifically, this invention relates to the mask blank including the phase shift film formed on the transparent substrate, in which the phase shift film has the function of transmitting ArF excimer laser exposure light (hereinafter referred to as "ArF exposure light") at the transmittance of 2% or higher and 30% or lower and the function of generating the phase difference of 150° or larger and 180° or smaller between the exposure light that has been transmitted through the phase shift film and the exposure light that has passed through air by a distance equal to the thickness of the phase shift film, the phase shift film is formed of a material containing a metal and silicon and has a structure including the lower layer and the upper layer that are laminated in the stated order from the transparent substrate side, the lower layer has the refractive index n at a wavelength of the exposure light that is smaller than that of the transparent substrate, the upper layer has the refractive index n at the wavelength of the exposure light that is larger than that of the transparent substrate, the lower layer has the extinction coefficient k at the wavelength of the exposure light that is larger than that of the upper layer, and the upper layer has the thickness that is larger than that of the lower layer.

FIG. 1 is a sectional view for illustrating a configuration of a mask blank 100 according to the embodiment of this invention. The mask blank 100 according to this invention illustrated in FIG. 1 has a structure in which a phase shift film 2, a light shielding film 3, and a hard mask film 4 are laminated on a transparent substrate 1 in the stated order.

The transparent substrate 1 can be formed of, besides synthetic quartz glass, quartz glass, aluminosilicate glass, soda-lime glass, a low thermal expansion glass (for example, $SiO_2$—$TiO_2$ glass), or other types of glass. Among others, the synthetic quartz glass has a high transmittance with respect to the ArF excimer laser light, and is therefore particularly preferred as a material for forming the transparent substrate 1 of the mask blank 100. The refractive index n of the material for forming the transparent substrate 1 at the wavelength (about 193 nm) of the ArF exposure light is preferably larger than 1.5 and smaller than 1.6, more preferably 1.52 or larger and 1.59 or smaller, still more preferably 1.54 or larger and 1.58 or smaller. In the following description, when described simply as "refractive index n", the refractive index n means the refractive index n at the wavelength of the ArF exposure light. When described simply as "extinction coefficient k", the extinction coefficient k means the extinction coefficient k at the wavelength of the ArF exposure light.

The phase shift film 2 is required to have the transmittance of 2% or higher and 30% or lower with respect to the ArF exposure light. In order to generate a sufficient phase shift effect between the exposure light that has been transmitted through the phase shift film 2 and the exposure light that has passed through the air, the transmittance of at least 2% with respect to the exposure light is required. The transmittance of the phase shift film 2 with respect to the exposure light is preferably 3% or higher, more preferably 4% or higher. Meanwhile, as the transmittance of the phase shift film 2 with respect to the exposure light increases, it becomes more difficult to increase the back-surface reflectance. Therefore, the transmittance of the phase shift film 2 with respect to the exposure light is preferably 30% or lower, more preferably 20% or lower, still more preferably 10% or lower.

In order to obtain an appropriate phase shift effect, the phase shift film 2 is required to be adjusted so that the phase shift film 2 has a phase difference in a range of 150° or larger and 180° or smaller between the ArF exposure light that has been transmitted therethrough and light that has passed through the air by a distance equal to a thickness of the phase shift film 2. The phase difference in the phase shift film 2 is preferably 155° or larger, more preferably 160° or larger. Meanwhile, the phase difference in the phase shift film 2 is preferably 179° or smaller, more preferably 177° or smaller. This is to reduce the effect of an increase in phase difference caused by the transparent substrate 1 being etched by a slight amount during dry etching in forming the pattern in the phase shift film 2. This is also because in recent years, in an increasing number of methods of irradiating a phase shift mask 200 with the ArF exposure light by an exposure apparatus, the ArF exposure light is allowed to enter from a direction that is inclined at a predetermined angle with respect to a direction perpendicular to a surface of the phase shift film 2.

The reflectance (back-surface reflectance) of the phase shift film 2 on the transparent substrate 1 side (back surface side) is required to be at least 20% or higher in view of suppression of thermal expansion of the pattern formed in the phase shift film 2 and displacement of the pattern. The back-surface reflectance of the phase shift film 2 with respect to the ArF exposure light is preferably 25% or higher, more preferably 30% or higher. Meanwhile, when the back-surface reflectance of the phase shift film 2 is too high, when exposure transfer is performed on a transfer target (for example, a resist film on a semiconductor wafer) using the phase shift mask 200 manufactured with the mask blank 100, reflected light on the back surface side of the phase shift film 2 greatly affects an exposure transfer image. Thus, a too high back-surface reflectance is not preferred. From the above-mentioned point of view, the back-surface reflectance of the phase shift film 2 with respect to the ArF exposure light is preferably 45% or lower, more preferably 40% or lower.

The phase shift film 2 has a structure in which a lower layer 21 and an upper layer 22 are laminated in the stated order from the transparent substrate 1 side. The whole phase shift film 2 is required to satisfy at least the above-mentioned conditions of the transmittance, the phase difference, and the back-surface reflectance. In order for the phase shift film 2 to satisfy the above-mentioned conditions, the refractive index n of the lower layer 21 is required to be at least smaller than the refractive index n of the transparent substrate 1. At the same time, the refractive index n of the upper layer 22 is required to be at least larger than the refractive index n of the transparent substrate 1. Further, the extinction coefficient k of the lower layer 21 is required to be at least larger than the extinction coefficient k of the upper layer 22. In addition, a thickness of the upper layer 22 is required to be at least larger than a thickness of the lower layer 21.

In order to satisfy the relationships between the lower layer 21 and the upper layer 22 of the phase shift film 2, the refractive index n of the lower layer 21 is required to be 1.50 or smaller. The refractive index n of the lower layer 21 is preferably 1.45 or smaller, more preferably 1.40 or smaller. Further, the refractive index n of the lower layer 21 is preferably 1.00 or larger, more preferably 1.10 or larger. The extinction coefficient k of the lower layer 21 is required to be 2.00 or larger. The extinction coefficient k of the lower layer 21 is preferably 2.20 or larger, more preferably 2.40 or larger. Further, the extinction coefficient k of the lower layer 21 is preferably 3.30 or smaller, more preferably 3.10 or smaller.

Meanwhile, in order to satisfy the relationships between the lower layer 21 and the upper layer 22 of the phase shift film 2, the refractive index n of the upper layer 22 is required to be 2.00 or larger. The refractive index n of the upper layer 22 is preferably 2.10 or larger. Further, the refractive index n of the upper layer 22 is preferably 3.00 or smaller, more preferably 2.80 or smaller. The extinction coefficient k of the upper layer 22 is required to be 0.80 or smaller. The extinction coefficient k of the upper layer 22 is preferably 0.60 or smaller, more preferably 0.50 or smaller. Further, the extinction coefficient k of the upper layer 22 is preferably 0.10 or larger, more preferably 0.20 or larger.

The refractive index n and the extinction coefficient k of a thin film including the phase shift film 2 are determined not only by a composition of the thin film. A film density and a crystalline state of the thin film, and other elements are also elements that affect the refractive index n and the extinction coefficient k. Therefore, the thin film is formed so as to have desired refractive index n and extinction coefficient k by adjusting various conditions for the formation of the thin film by reactive sputtering. The refractive index n and the extinction coefficient k are set within the above-mentioned ranges not only by adjusting a ratio of a mixed gas of a rare gas and a reactive gas (for example, an oxygen gas or a nitrogen gas) at the time of the film formation by the reactive sputtering. A wide variety of conditions including a pressure in a film formation chamber at the time of the film formation by the reactive sputtering, electric power applied to a sputtering target, and a positional relationship, for example, a distance between the target and the transparent substrate 1, can be adjusted. Further, those film formation conditions are peculiar to a film forming apparatus, and are appropriately adjusted so that the formed lower layer 21 and the formed upper layer 22 each have the desired refractive index n and extinction coefficient k.

Meanwhile, in view of reduction of an EMF bias in the phase shift mask 200 manufactured with the mask blank 100 as described above, it is desired that the thickness of the phase shift film 2 be smaller than 100 nm. Meanwhile, the above-mentioned relationship in thickness between the lower layer 21 and the upper layer 22 of the phase shift film 2 is also required to be satisfied. In particular, in consideration of the transmittance of the phase shift film 2 as a whole with respect to the ArF exposure light, the thickness of the lower layer 21 is preferably smaller than 10 nm, more preferably 9 nm or smaller, still more preferably 8 nm or smaller. Further, in particular, in consideration of the back-surface reflectance of the phase shift film 2, the thickness of the lower layer 21 is preferably 3 nm or larger, more preferably 4 nm or larger, still more preferably 5 nm or larger.

In particular, in consideration of the phase difference and the back-surface reflectance of the phase shift film 2 as a whole with respect to the ArF exposure light, the thickness of the upper layer 22 is preferably 9 times or more larger than the thickness of the lower layer 21, more preferably 10 times or more larger. Further, in consideration of the thickness of the phase shift film 2 being set to smaller than 100 nm, the thickness of the upper layer 22 is preferably 15 times or more smaller than the thickness of the lower layer 21, more preferably 13 times or more smaller. The thickness of the upper layer 22 is preferably 90 nm or smaller, more preferably 80 nm or smaller.

Both of the lower layer 21 and the upper layer 22 of the phase shift film 2 are made of materials containing a metal and silicon. As a metal element to be contained in the material for forming the phase shift film 2, a transition metal element is preferred. Examples of the transition metal element in this case include one or more metal elements of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd). In addition, examples of the metal element to be contained in the material for forming the phase shift film 2 other than the transition metal element include aluminum (Al), indium (In), tin (Sn), and gallium (Ga). The material for forming the phase shift film 2 may contain, in addition to the above-mentioned elements, an element, such as carbon (C), hydrogen (H), boron (B), germanium (Ge), or antimony (Sb). In addition, the material for forming the lower layer 21 may contain an inert gas, such as helium (He), argon (Ar), krypton (Kr), or xenon (Xe).

The lower layer 21 of the phase shift film 2 is formed of a material containing a metal and silicon, which is substantially free from oxygen. A material containing oxygen is not preferred because, although a material having the large extinction coefficient k is required to be used for the lower layer 21, a degree of reduction of the extinction coefficient k caused by increasing an oxygen content of the material is extremely large. Thus, the lower layer 21 is required to be formed of the material that is substantially free from oxygen. In this case, the material that is substantially free from oxygen is a material having the oxygen content of at least 5 atomic % or less in the material. The oxygen content of the material for forming the lower layer 21 is preferably 3 atomic % or less, more preferably a detection lower limit value or less when a composition analysis using X-ray photoelectron spectroscopy or other methods is conducted.

Further, the material for forming the lower layer 21 may contain nitrogen. However, as a nitrogen content of the material is increased, the refractive index n of the material tends to increase. Further, the extinction coefficient k tends to decrease as the nitrogen content of the material is increased although the degree of decrease is not as large as that in the case of oxygen. As the material for forming the lower layer 21, a material having the small refractive index n and the large extinction coefficient k is preferred. Based on the above-mentioned facts, in a case where the lower layer 21 is formed of a material containing a metal, silicon, and nitrogen, the nitrogen content is preferably 20 atomic % or less, more preferably 19 atomic % or less, still more preferably 15 atomic % or less. Meanwhile, the nitrogen content of the material for forming the lower layer 21 in this case is preferably 5 atomic % or larger, more preferably 10 atomic % or larger. The lower layer 21 is preferably formed of a material containing a metal and silicon or a material containing a metal, silicon, and nitrogen, more preferably formed of a material containing a metal and silicon.

The upper layer 22 of the phase shift film 2 is formed of a material containing a metal, silicon, nitrogen, and oxygen. The lower layer 21 of the phase shift film 2 is required to be formed of the material having the large extinction coefficient k, and therefore the upper layer 22 is required to positively contain not only nitrogen but also oxygen. In consideration of this fact, an oxygen content of the material for forming the upper layer 22 is preferably larger than 5 atomic %, more preferably 10 atomic % or larger, still more preferably 12 atomic % or larger. Oxygen has a tendency to decrease both the refractive index n and the extinction coefficient k of the material as the content of oxygen in the material increases. Therefore, as the oxygen content of the upper layer 22 increases, the thickness of the phase shift film 2 as a whole, which is required to ensure the predetermined transmittance and the predetermined phase difference of the whole phase shift film 2 with respect to the ArF exposure light, increases. In view of the above-mentioned facts, the oxygen content of the material for forming the upper layer 22 is preferably 30 atomic % or less, more preferably 25 atomic % or less, still more preferably 20 atomic % or less.

Nitrogen has a tendency to relatively increase the refractive index n of the material and relatively decrease the extinction coefficient k of the material as the content of nitrogen in the material increases. The nitrogen content of the material for forming the upper layer 22 is preferably 20 atomic % or larger, more preferably 25 atomic % or larger, still more preferably 30 atomic % or larger. Meanwhile, the nitrogen content of the material for forming the upper layer 22 is preferably 50 atomic % or less, more preferably 45 atomic % or less, still more preferably 40 atomic % or less.

The lower layer 21 is preferably formed in contact with a surface of the transparent substrate 1. This is because a higher effect of increasing the back-surface reflectance can be provided by the laminate structure of the lower layer 21 and the upper layer 22 of the phase shift film 2 described above with a structure in which the lower layer 21 is in contact with the surface of the transparent substrate 1. An etching stopper film may be formed between the transparent substrate 1 and the phase shift film 2 as long as an influence of the etching stopper film on the effect of increasing the back-surface reflectance of the phase shift film 2 is extremely small. In this case, a thickness of the etching stopper is required to be 10 nm or smaller, preferably 7 nm or smaller, more preferably 5 nm or smaller. Further, in view of effectively functioning as the etching stopper, the etching stopper film is required to have a thickness of 3 nm or larger. The extinction coefficient k of a material for forming the etching stopper film is required to be smaller than 0.1, more preferably 0.05 or smaller, still more preferably 0.01 or smaller. Further, the refractive index n of the material for forming the etching stopper film in this case is required to be at least 1.9 or smaller, preferably 1.7 or smaller. The refractive index n of the material for forming the etching stopper film is preferably 1.55 or larger.

A ratio [%] obtained by dividing a content [atomic %] of the metal in the material for forming the upper layer 22 by a total content [atomic %] of the metal and silicon (hereinafter the ratio is referred to as "M/[M+Si] ratio") is required to be smaller than an M/[M+Si] ratio of the lower layer 21. Within a range in which the M/[M+Si] ratio of the material is from 0% to about 34%, both the refractive index n and the extinction coefficient k have a tendency to increase as the M/[M+Si] ratio increases. For the upper layer 22, a material having a tendency to have the large refractive index n and the small extinction coefficient k is required to be used, and hence it is preferred to adopt the material having the small M/[M+Si] ratio. On the other hand, a material having the small refractive index n and the large extinction coefficient k is required to be used for the lower layer 21, and hence it is preferred to adopt the material having the relatively large M/[M+Si] ratio.

It is preferred that a difference obtained by subtracting the M/[M+Si] ratio of the upper layer 22 from the M/[M+Si] ratio of the lower layer 21 be at least 1% or larger. In addition, it is preferred that a difference obtained by subtracting the M/[M+Si] ratio of the upper layer 22 from the M/[M+Si] ratio of the lower layer 21 be at least 10% or smaller, more preferably 8% or smaller. The M/[M+Si] ratio of the material for forming the lower layer 21 is required to be at least 8% or larger, preferably 9% or larger, more preferably 10% or larger. In addition, the M/[M+Si] ratio of the material for forming the lower layer 21 is required to be at least 20% or smaller, preferably 15% or smaller, more preferably 12% or smaller.

In view of the reduction of the transmittance and a variation in phase shift amount of the phase shift film 2, not only oxygen is desired to be contained in the upper layer 22 in advance, but also a metal content of the upper layer 22 is desired to be reduced. When the metal element that contributes to increasing both the refractive index n and the extinction coefficient k is not contained in the material for forming the upper layer 22 of the phase shift film 2, however, there arises a problem in that the total thickness of the phase shift film 2 is increased. Further, when the upper layer 22 is formed by a DC sputtering method, there is also a problem in that the number of defects due to a low conductivity of a metal silicide target increases. In view of the above-mentioned points, the M/[M+Si] ratio of the upper layer 22 is preferably set to 2% or larger, more preferably 3% or larger. On the other hand, in view of the reduction of the transmittance and the variation in phase shift amount of the phase shift film 2 (upper layer 22), the M/[M+Si] ratio of the upper layer 22 is preferably set to 9% or smaller, more preferably 8% or smaller.

It is preferred that the material for forming the lower layer 21 and the material for forming the upper layer 22 contain the same metal element. The upper layer 22 and the lower layer 21 are patterned by dry etching using the same etching glass. Therefore, it is desired to etch the upper layer 22 and the lower layer 21 in the same etching chamber. When the metal element contained in the material for forming the upper layer 22 and the metal element contained in the material for forming the lower layer 21 are the same, an environmental change inside the etching chamber that occurs when a dry etching target is changed from the upper layer 22 to the lower layer 21 can be reduced.

The lower layer 21 and the upper layer 22 of the phase shift film 2 are formed by sputtering, and any kinds of sputtering including the DC sputtering, RF sputtering, and ion-beam sputtering are applicable. In view of a film formation rate, it is preferred to use the DC sputtering. When a target having a low conductivity is used, it is preferred to use the RF sputtering or the ion-beam sputtering. In view of the film formation rate, however, it is preferred to use the RF sputtering.

In a step of forming the lower layer 21 and the upper layer 22 of the phase shift film 2 by sputtering, the lower layer 21 and the upper layer 22 cannot be formed with the same single target. This is because the M/[M+Si] ratio of the lower layer 21 and the M/[M+Si] ratio of the upper layer 22 differ from each other. When the lower layer 21 and the upper layer 22 are formed with two targets having the different M/[M+Si] ratios, the lower layer 21 and the upper layer 22 may be formed in the same film formation chamber or may be formed in different film formation chambers. Further, the lower layer 21 and the upper layer 22 having the different M/[M+Si] ratios may be formed using a silicon target and a metal silicide target for the lower layer 21 and the upper layer 22, respectively, by sputtering for changing a voltage to be applied for each of the targets. In a case where the lower layer 21 and the upper layer 22 are formed in different film formation chambers, it is preferred to provide a structure in which the film formation chambers are coupled to each other through, for example, another vacuum chamber. In this case, it is preferred to couple a load lock chamber, through which the transparent substrate 1 in the air is to pass when being introduced into the vacuum chamber, to the vacuum chamber. Further, it is preferred to provide a conveying apparatus (robot hand) configured to convey the transparent substrate 1 between the load lock chamber, the vacuum chamber, and the film formation chambers.

It is desired that the upper layer 22 include a layer as a surface layer, which has a larger oxygen content than that of the upper layer 22 excluding the surface layer (hereinafter referred to simply as "surface oxide layer"). As a method of forming the surface oxide layer of the upper layer 22, a variety of oxidation treatments are applicable. Examples of the oxidation treatment include heat treatment in the air and other such gas containing oxygen, light irradiation treatment in gas containing oxygen with a flash lamp or the like, and processing of bringing ozone or oxygen plasma into contact with the uppermost surface. In particular, it is preferred to form the surface oxide layer in the upper layer 22 with use of the heat treatment or the light irradiation treatment with the flash lamp or the like, with which the action of reducing a film stress of the phase shift film 2 is obtained at the same time. The surface oxide layer of the upper layer 22 has a thickness of preferably 1 nm or larger, more preferably 1.5 nm or larger. Meanwhile, the surface oxide layer of the upper layer 22 has a thickness of preferably 5 nm or smaller, more preferably 3 nm or smaller. The refractive index n and the extinction coefficient k of the upper layer 22 described above are average values of the whole upper layer 22 including the surface oxide layer. A ratio of the surface oxide layer in the upper layer 22 is considerably small. Therefore, an influence of the presence of the surface oxide layer on the refractive index n and the extinction coefficient k of the whole upper layer 22 is small.

Figure 2:
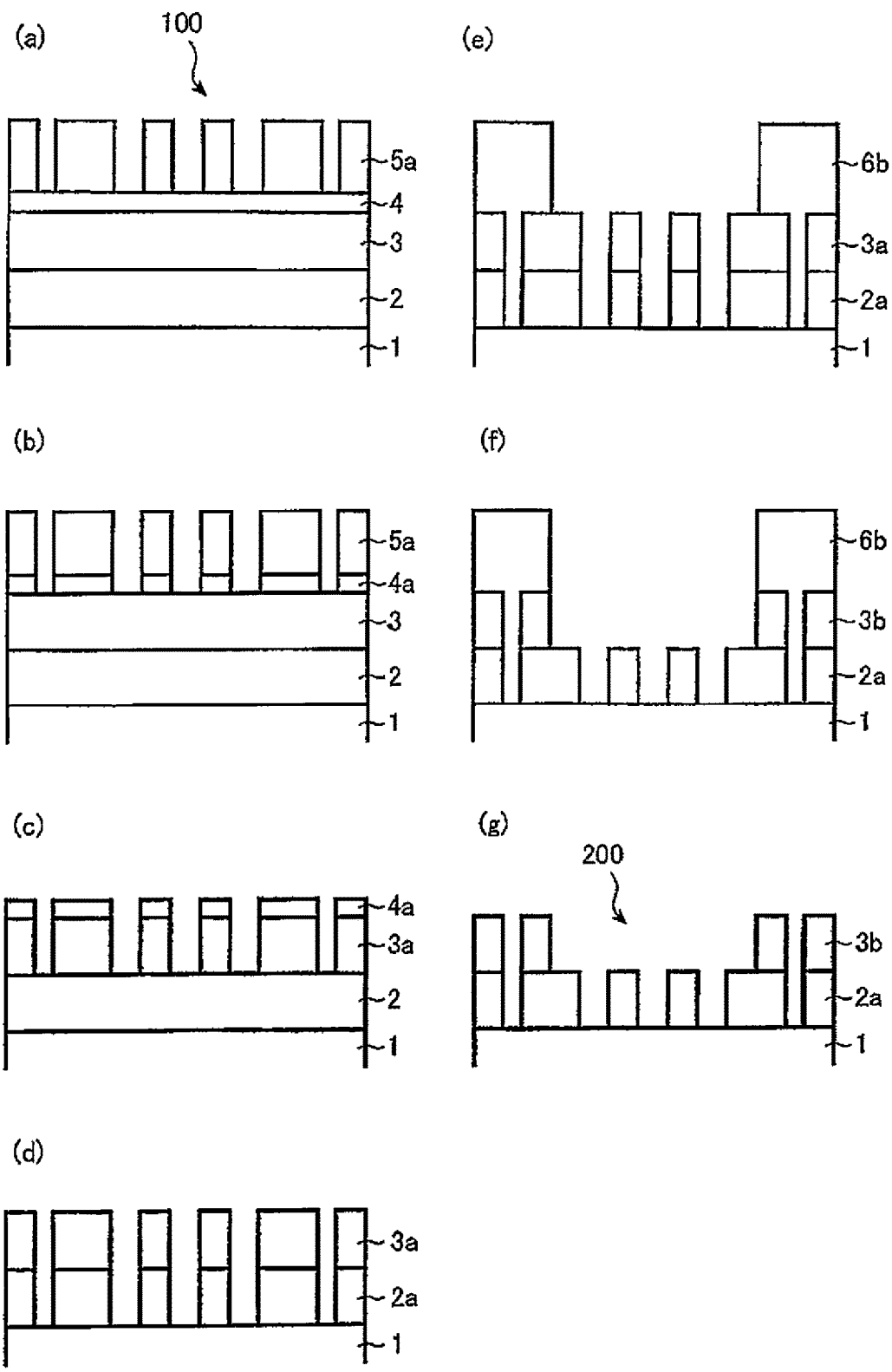
FIG. 2 includes schematic sectional views for illustrating steps of manufacturing a phase shift mask according to the embodiment of this invention.

The mask blank 100 includes the light shielding film 3 on the phase shift film 2. An outer peripheral region of a region on which a transfer pattern is formed (transfer pattern forming region) of a binary type transfer mask is generally required to ensure an optical density (OD) equal to or larger than a predetermined value so that a resist film on a semiconductor wafer is not affected by the exposure light transmitted through the outer peripheral region when exposure transfer is performed on the resist film using an exposure apparatus. The same applies to the phase shift mask 200. In general, the outer peripheral region of the transfer mask including the phase shift mask 200 desirably has the OD equal to or larger than 3.0, and is required to have the OD of at least 2.8 or larger. The phase shift film 2 has a function of transmitting the exposure light at a predetermined transmittance. With the phase shift film 2 alone, it is difficult to ensure the predetermined value of the optical density. Therefore, the light shielding film 3 is required to be laminated on the phase shift film 2 in a stage of manufacturing the mask blank 100 so as to cover an insufficiency in optical density. With the configuration of the mask blank 100 described above, when a portion of the light shielding film 3 which is present in a region using a phase shift effect (basically, the transfer pattern forming region) is removed during a process of manufacturing the phase shift mask 200 (see FIG. 2), the phase shift mask 200 including the outer peripheral region for which the predetermined value of the optical density is ensured can be manufactured.

The light shielding film 3 is applicable to any of a single-layer structure and a laminate structure including two or more layers. Each of the light shielding film 3 having the single-layer structure and the light shielding film 3 having the laminate structure including two or more layers may be configured to have a composition which is substantially the same in a thickness direction of the film or the layer or a composition graded in the thickness direction of the layer.

The mask blank 100 in the mode illustrated in FIG. 1 has a structure in which the light shielding film 3 is laminated on the phase shift film 2 without intermediation of another film therebetween. For the light shielding film 3 in this configuration, it is required to use a material having sufficient etching selectivity to an etching gas to be used to form the pattern in the phase shift film 2. The light shielding film 3 in this case is preferably formed of a material containing chromium. As the material containing chromium to be used to form the light shielding film 3, besides a chrome metal, there is a material containing one or more elements selected from oxygen, nitrogen, carbon, boron, and fluorine in addition to chromium. A chromium-based material is generally etched with a mixed gas of a chlorine-based gas and an oxygen gas, but an etching rate of the chrome metal to the etching gas is not so high. In view of an increase in the etching rate to the etching gas being the mixed gas of the chlorine-based gas and the oxygen gas, the material containing one or more elements selected from oxygen, nitrogen, carbon, boron, and fluorine in addition to chromium is preferred as the material for forming the light shielding film 3. Further, the material containing chromium which forms the light shielding film 3 may contain one or more elements of molybdenum, indium, and tin. When the material contains one or more elements of molybdenum, indium, and tin, the etching rate with respect to the mixed gas of the chlorine-based gas and the oxygen gas can be further increased.

Meanwhile, this invention includes a configuration in which another film (etching stopper film) is provided between the phase shift film 2 and the light shielding film 3 as the mask blank 100 of another embodiment. In this case, it is preferred to form the etching stopper film of the above-mentioned material containing chromium and to form the light shielding film 3 of a material containing silicon or a material containing tantalum.

The material containing silicon which forms the light shielding film 3 may contain a transition metal or may contain a metal element other than the transition metal. This is because, when the light shielding film 3 contains the transition metal, light shielding performance thereof is greatly improved as compared to a case in which the transition metal is not contained, and hence a thickness of the light shielding film 3 can be reduced. Examples of the transition metal to be contained in the light shielding film 3 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd), and alloys of those metals. Examples of metal elements other than the transition metal element to be contained in the light shielding film 3 include aluminum (Al), indium (In), tin (Sn), and gallium (Ga).

It is preferred that the mask blank 100 have a structure in which the hard mask film 4 formed of a material having etching selectivity with respect to the etching gas to be used to etch the light shielding film 3 is laminated on the light shielding film 3. It is indispensable for the light shielding film 3 to have a function of ensuring the predetermined optical density, and hence there is a limitation in the reduction of the thickness thereof. The hard mask film 4 only needs to have a thickness which allows the hard mask film 4 to function as an etching mask until the dry etching for forming the pattern in the light shielding film 3 immediately below the hard mask film 4 ends, and therefore the thickness thereof is basically not limited by the optical density. Thus, a thickness of the hard mask film 4 can be set remarkably smaller than the thickness of the light shielding film 3. The resist film made of an organic material only needs to have a film thickness which allows the resist film to function as the etching mask until the dry etching for forming the pattern in the hard mask film 4 ends. Therefore, the thickness of the resist film can be set remarkably smaller than that of a related-art one. The reduction in thickness of the resist film is effective in improvement of a resist resolution and prevention of pattern tilt, and is extremely important in responding to a finer pattern requirement.

When the light shielding film 3 is formed of the material containing chromium, it is preferred that the hard mask film 4 be formed of the above-mentioned material containing silicon. The hard mask film 4 in this case tends to have low adhesion to the resist film made of the organic material. Therefore, it is preferred to perform hexamethyldisilazane (HMDS) treatment on the surface of the hard mask film 4 to improve the adhesion of the surface. It is more preferred that the hard mask film 4 in this case be formed of $SiO_2$, SiN, SiON, or other materials.

Further, as the material of the hard mask film 4 used when the light shielding film 3 is formed of the material containing chromium, a material containing tantalum can also be used besides the above-mentioned materials. In this case, as the material containing tantalum, besides a tantalum metal, there can be given a material containing one or more elements selected from nitrogen, oxygen, boron, and carbon in tantalum. Examples of the material include Ta, TaN, TaO, TaON, TaBN, TaBO, TaBON, TaCN, TaCO, TaCON, TaBCN, and TaBOCN. Further, when the light shielding film 3 is formed of the material containing silicon, it is preferred that the hard mask film 4 be formed of the above-mentioned material containing chromium.

In the mask blank 100, it is preferred that the resist film made of the organic material be formed in contact with the surface of the hard mask film 4 so as to have a thickness equal to or smaller than 100 nm. In a case of a fine pattern compatible with the DRAM hp 32-nm generation, a sub-resolution assist feature (SRAF) having a line width of 40 nm is sometimes provided to the transfer pattern (phase shift pattern) to be formed in the hard mask film 4. Even in this case, however, a cross-section aspect ratio of a resist pattern can be reduced to be as small as 1:2.5. Therefore, tilt or detachment of the resist pattern can be suppressed during development, rinsing, or other treatments of the resist film. The film thickness of the resist film is more preferably 80 nm or smaller.

The phase shift mask 200 of this embodiment has features in that the transfer pattern (phase shift pattern) is formed in the phase shift film 2 of the mask blank 100 and a light shielding band pattern is formed in the light shielding film 3. In a case of the structure in which the mask blank 100 includes the hard mask film 4, the hard mask film 4 is removed during production of the phase shift mask 200.

A method of manufacturing the phase shift mask 200 according to this invention uses the above-mentioned mask blank 100, and includes a step of forming the transfer pattern in the light shielding film 3 by dry etching, a step of forming the transfer pattern in the phase shift film 2 by dry etching using the light shielding film 3 having the transfer pattern as a mask, and a step of forming the light shielding band pattern in the light shielding film 3 by dry etching using a second resist pattern 6b having the light shielding band pattern as a mask. Now, the method of manufacturing the phase shift mask 200 of this invention is described in accordance with manufacturing steps illustrated in FIGS. 2. The method of manufacturing the phase shift mask 200 using the mask blank 100 including the hard mask film 4 laminated on the light shielding film 3 is described herein. Further, the material containing chromium is used for the light shielding film 3, whereas the material containing silicon is used for the hard mask film 4.

First, a resist film is formed in contact with the hard mask film 4 in the mask blank 100 by a spin coating method. Next, exposure drawing of a first pattern being the transfer pattern (phase shift pattern) to be formed in the phase shift film 2 is performed on the resist film with an electron beam. Further, predetermined treatment such as development treatment is performed to form a first resist pattern 5a having the phase shift pattern (see FIG. 2(a)). Subsequently, dry etching using the fluorine-based gas is performed using the first resist pattern 5a as a mask to form a first pattern (hard mask pattern 4a) in the hard mask film 4 (see FIG. 2(b)).

Next, after the first resist pattern 5a is removed, dry etching using the mixed gas of the chlorine-based gas and the oxygen gas is performed using the hard mask pattern 4a as a mask to form a first pattern (light shielding pattern 3a) in the light shielding film 3 (see FIG. 2(c)). Subsequently, dry etching using the fluorine-based gas is performed using the light shielding pattern 3a as a mask to form a first pattern (phase shift pattern 2a) in the phase shift film 2 and to remove the hard mask pattern 4a at the same time (see FIG. 2(d)).

Next, a resist film is formed on the mask blank 100 by the spin coating method. Next, exposure drawing of a second pattern being a pattern (light shielding band pattern) to be formed in the light shielding film 3 is performed on the resist film with the electron beam. Further, the predetermined treatment, for example, development treatment, is performed to form the second resist pattern 6b having the light shielding pattern (see FIG. 2(e)). Subsequently, dry etching using the mixed gas of the chlorine-based gas and the oxygen gas is performed using the second resist pattern 6b as a mask to form a second pattern (light shielding pattern 3b) in the light shielding film 3 (see FIG. 2(f)). Further, after the second resist pattern 6b is removed, the resultant is subjected to predetermined treatment, for example, cleaning (see FIG. 2(g)), and the phase shift mask 200 is consequently obtained.

The chlorine-based gas used in the above-mentioned dry etching is not particularly limited as long as Cl is contained therein. Examples thereof include $Cl_2$, $SiCl_2$, $CHCl_3$, $CH_2Cl_2$, $CCl_4$, and $BCl_3$. In addition, the fluorine-based gas used in the above-mentioned dry etching is not particularly limited as long as F is contained therein. Examples thereof include $CHF_3$, $CF_4$, $C_2F_6$, $C_4F_8$, and $SF_6$. In particular, the fluorine-based gas that is free from C has a relatively low etching rate with respect to a glass substrate, and hence damage to the glass substrate can further be reduced with use of such a gas.

The phase shift mask 200 of this invention is produced using the above-mentioned mask blank 100. Therefore, the phase shift film 2 in which the transfer pattern is formed (phase shift pattern 2a) has the transmittance of 2% or higher and 30% or lower with respect to the ArF exposure light, and the phase difference is 150° or larger and 180° or smaller between the exposure light that has been transmitted through the phase shift pattern 2a and the exposure light that has passed through the air by a distance equal to a thickness of the phase shift pattern 2a.

The phase shift mask 200 of this invention includes the phase shift pattern 2a having the back-surface reflectance of at least 20% or larger with respect to the ArF exposure light. Therefore, thermal expansion of the phase shift pattern 2a, which is caused by irradiation of the ArF exposure light, and displacement of the phase shift pattern 2a, which is associated with the thermal expansion, can be suppressed.

A method of manufacturing a semiconductor device of this invention has a feature of using the above-mentioned shift mask 200 or the phase shift mask 200 manufactured using the above-mentioned mask blank 100 to perform exposure transfer of the pattern onto the resist film on a semiconductor substrate. Therefore, even when the phase shift mask 200 is placed in an exposure apparatus and the ArF exposure light is radiated onto the phase shift mask 200 from the transparent substrate 1 side to perform the exposure transfer onto the transfer target (for example, the resist film on the semiconductor wafer), a desired pattern can be transferred onto the transfer target with high accuracy.

EXAMPLES

Now, the embodiment of this invention is described more specifically by means of Examples.

Example 1

[Manufacture of Mask Blank]

The transparent substrate 1, which was made of synthetic quartz glass having dimensions of a main surface of about 152 mm by about 152 mm and a thickness of about 6.35 mm, was prepared. The transparent substrate 1 was a substrate having its end surfaces and the main surface polished to a predetermined surface roughness, and then being subjected to predetermined cleaning treatment and drying treatment.

Next, the transparent substrate 1 was placed in a sheet-type DC sputtering apparatus, and the lower layer 21 (MoSi film) of the phase shift film 2, which was made of molybdenum and silicon, was formed on the transparent substrate 1 so as to have a thickness of 7 nm by reactive sputtering (DC sputtering) using a mixed target of molybdenum (Mo) and silicon (Si) (Mo:Si=11 atomic %:89 atomic %), and using a mixed gas of argon (Ar) and helium (He) as a sputtering gas.

Next, the transparent substrate 1 having the lower layer 21 formed thereon was placed in the sheet-type DC sputtering apparatus. The upper layer 22 (MoSiON film) of the phase shift film 2, which was made of molybdenum, silicon, nitrogen, and oxygen, was formed on the lower layer 21 so as to have a thickness of 72 nm by the reactive sputtering (DC sputtering). In the reactive sputtering for forming the upper layer 22, the upper layer 22 is formed with use of a mixed target of molybdenum (Mo) and silicon (Si) (Mo:Si=4 atomic %:96 atomic %), and a mixed gas of argon (Ar), nitrogen ($N_2$), oxygen ($O_2$), and helium (He) was used as a sputtering gas. Through the procedure described above, the phase shift film 2 including the laminate of the lower layer 21 and the upper layer 22 was formed in contact with the surface of the transparent substrate 1 so as to have a thickness of 79 nm.

Next, heat treatment for reducing a film stress of the phase shift film 2 and for forming an oxidation layer in a surface layer was performed on the transparent substrate 1 having the phase shift film 2 formed thereon. Specifically, the heat treatment was performed in the air at a heating temperature of 450° C. for heating time of 1 hour using a heating furnace (electrical furnace). The phase shift film 2 including the laminate of the lower layer 21 and the upper layer 22, which was formed on a main surface of another transparent substrate 1 under the same conditions and had been subjected to heat treatment, was prepared. When the transmittance and the phase difference of the phase shift film 2 with respect to light having the wavelength of 193 nm were measured using a phase shift amount measurement apparatus (MPM193 manufactured by Lasertec Corporation), the transmittance was 6.0%, and the phase difference was 170.0° (deg). Moreover, when the phase shift film 2 was analyzed with a STEM and EDX, it was confirmed that the oxidation layer was formed at a thickness of about 1.7 nm from the surface of the upper layer 22 of the phase shift film 2. Further, when respective optical characteristics of the lower layer 21 and the upper layer 22 of the phase shift film 2 were measured, the lower layer 21 had the refractive index n of 1.15 and the extinction coefficient k of 2.90, and the upper layer 22 had the refractive index n of 2.38 and the extinction coefficient k of 0.31. Further, a front-surface reflectance (reflectance on the surface side of the phase shift film 2) of the phase shift film 2 with respect to light having a wavelength of 193 nm was 20.3%, whereas a back-surface reflectance (reflectance on the transparent substrate 1 side) thereof was 44.0%.

Next, the transparent substrate 1 having the phase shift film 2 formed thereon was placed in the sheet-type DC sputtering apparatus. A lowermost layer of the light shielding film 3 made of CrOCN was formed in the phase shift film 2 so as to have a thickness of 30 nm by the reactive sputtering (DC sputtering). In the reactive sputtering for forming the lowermost layer of the light shielding film 3, a chromium (Cr) target was used, a mixed gas of argon (Ar), carbon dioxide ($CO_2$), nitrogen ($N_2$), and helium (He) (at a ratio of flow rates of Ar:$CO_2$:$N_2$:He=22:39:6:33 and a pressure of 0.2 Pa) was used as a sputtering gas, and electric power of a DC power source was set to 1.9 kW.

Next, a lower layer of the light shielding film 3, which was made of CrN, was formed on the lowermost layer of the light shielding film 3 so as to have a thickness of 4 nm by the reactive sputtering (DC sputtering). In the reactive sputtering for forming the lower layer of the light shielding film 3, a chromium (Cr) target was used, a mixed gas of argon (Ar) and nitrogen ($N_2$) (at a ratio of flow rates of Ar:$N_2$=83:17 and a pressure of 0.1 Pa) was used as a sputtering gas, and electric power of the DC power source was set to 1.4 kW.

Next, an upper layer of the light shielding film 3, which was made of CrOCN, was formed on the lower layer of the light shielding film 3 so as to have a thickness of 14 nm by the reactive sputtering (DC sputtering). In the reactive sputtering for forming the upper layer of the light shielding film 3, a chromium (Cr) target was used, a mixed gas of argon (Ar), carbon dioxide ($CO_2$), nitrogen ($N_2$), and helium (He) (at a ratio of flow rates of Ar:$CO_2$:$N_2$:He=21:37:11:31 and a pressure of 0.2 Pa) was used as a sputtering gas, and electric power of the DC power source was set to 1.9 kW. Through the procedure described above, the light shielding film 3 made of the chromium-based material and having a three-layer structure including the lowermost layer made of CrOCN, the lower layer made of CrN, and the upper layer made of CrOCN in the stated order from the phase shift film 2 side was formed so as to have a total film thickness of 48 nm. When the optical density (OD) in the laminate structure of the phase shift film 2 and the light shielding film 3 with respect to the light having the wavelength of 193 nm was measured, the optical density was 3.0 or larger.

Further, the transparent substrate 1 having the phase shift film 2 and the light shielding film 3 laminated thereon was placed in a sheet-type RF sputtering apparatus and the hard mask film 4 made of silicon and oxygen was formed on the light shielding film 3 so as to have a thickness of 5 nm by RF sputtering. In the RF sputtering for forming the hard mask film 4, a silicon dioxide ($SiO_2$) target was used and an argon (Ar) gas was used as a sputtering gas. Through the procedure described above, the mask blank 100 having the structure in which the phase shift film 2 having the double-layer structure, the light shielding film 3, and the hard mask film 4 were laminated on the transparent substrate 1 was manufactured.

[Manufacture of Phase Shift Mask]

Next, the phase shift mask 200 according to Example 1 was produced using the mask blank 100 according to Example 1. First, the HMDS treatment was performed on the surface of the hard mask film 4. Subsequently, a resist film made of a chemically amplified resist for electron beam lithography was formed in contact with the surface of the hard mask film 4 so as to have a film thickness of 80 nm by the spin coating method. Next, the first pattern being the phase shift pattern to be formed in the phase shift film 2 was drawn in the resist film with an electron beam. Then, predetermined development treatment and cleaning treatment were performed to form the first resist pattern 5a having the first pattern (see FIG. 2(a)).

Next, dry etching using a $CF_4$ gas was performed using the first resist pattern 5a as a mask to form the first pattern (hard mask pattern 4a) in the hard mask film 4 (see FIG. 2(b)).

Next, the first resist pattern 5a was removed. Subsequently, dry etching using the hard mask pattern 4a as a mask and using a mixed gas of chlorine and oxygen (at a ratio of gas flow rates: $Cl_2$:$O_2$=4:1) was performed to form the first pattern (light shielding pattern 3a) in the light shielding film 3 (see FIG. 2(c)). Next, dry etching using the light shielding pattern 3a as a mask and using a fluorine-based gas ($SF_6$+He) was performed to form the first pattern (phase shift pattern 2a) in the phase shift film 2 and to remove the hard mask pattern 4a at the same time (see FIG. 2(d)).

Next, a resist film made of a chemically amplified resist for electron beam lithography was formed on the light shielding pattern 3a so as to have a film thickness of 150 nm by the spin coating method. Next, the second pattern being the pattern (light shielding band pattern) to be formed in the light shielding film 3 was drawn in the resist film through light exposure. Further, the predetermined treatment, for example, the development treatment, was performed to form the second resist pattern 6b having the light shielding pattern (see FIG. 2(e)). Subsequently, dry etching using the second resist pattern 6b as a mask and using the mixed gas of chlorine and oxygen (at a ratio of gas flow rates: $Cl_2$:$O_2$=4:1) was performed to form the second pattern (light shielding pattern 3b) in the light shielding film 3 (see FIG. 2(f)). Further, the second resist pattern 6b was removed. Through predetermined treatment, for example, cleaning, the phase shift mask 200 was obtained (see FIG. 2(g)).

The thus produced halftone-type phase shift mask 200 according to Example 1 was placed on a mask stage of the exposure apparatus using the ArF excimer laser as the exposure light. The ArF exposure light was radiated onto the phase shift mask 200 from the transparent substrate 1 side to transfer the pattern onto the resist film on the semiconductor device through light exposure. Predetermined treatment was performed on the resist film after the exposure transfer to form the resist pattern. The resist pattern was observed with a scanning electron microscope (SEM). As a result, a positional shift amount from a design pattern was within an allowable range in all portions within a plane. Based on the result, it can be said that a circuit pattern can be formed with high accuracy on the semiconductor device by using the resist pattern as the mask.

Example 2

[Manufacture of Mask Blank]

The mask blank 100 according to Example 2 was manufactured in the same procedure as that of Example 1 except for the phase shift film 2. For the phase shift film 2 according to Example 2, the materials for forming the lower layer 21 and the upper layer 22 and the film thicknesses of the lower layer 21 and the upper layer 22 were changed. Specifically, the transparent substrate 1 was placed in the sheet-type DC sputtering apparatus. The lower layer 21 (MoSiN film) of the phase shift film 2, which was made of molybdenum, silicon, and nitrogen, was formed on the transparent substrate 1 so as to have a thickness of 7 nm by the reactive sputtering (DC sputtering). In the reactive sputtering for forming the lower layer 21, a mixed target of molybdenum (Mo) and silicon (Si) (Mo:Si=11 atomic %:89 atomic %) was used, and a mixed gas of argon (Ar), nitrogen ($N_2$), and helium (He) was used as a sputtering gas.

Next, the transparent substrate 1 having the lower layer 21 formed thereon was placed in the sheet-type DC sputtering apparatus. The upper layer 22 (MoSiON film) of the phase shift film 2, which was made of molybdenum, silicon, nitrogen, and oxygen, was formed on the lower layer 21 so as to have a thickness of 88 nm by the reactive sputtering (DC sputtering). In the reactive sputtering for forming the upper layer 22, a mixed target of molybdenum (Mo) and silicon (Si) (Mo:Si=8 atomic %:92 atomic %) was used, and a mixed gas of argon (Ar), nitrogen ($N_2$), oxygen ($O_2$), and helium (He) was used as a sputtering gas. Through the procedure described above, the phase shift film 2 including the laminate of the lower layer 21 and the upper layer 22 was formed in contact with the surface of the transparent substrate 1 so as to have a thickness of 95 nm.

Further, under the same treatment conditions as those of Example 1, heat treatment was performed on the phase shift film 2 according to Example 2. The phase shift film 2 according to Example 2, which was formed on a main surface of another transparent substrate 1 under the same conditions and had been subjected to heat treatment, was prepared. When the transmittance and the phase difference of the phase shift film 2 with respect to light having the wavelength of 193 nm were measured using the phase shift amount measurement apparatus (MPM193 manufactured by Lasertec Corporation), the transmittance was 6.0%, and the phase difference was 170.4° (deg). Moreover, when the phase shift film 2 was analyzed with the STEM and the EDX, it was confirmed that the oxidation layer was formed at a thickness of about 1.6 nm from the surface of the upper layer 22 of the phase shift film 2. Further, when respective optical characteristics of the lower layer 21 and the upper layer 22 of the phase shift film 2 were measured, the lower layer 21 had the refractive index n of 1.34 and the extinction coefficient k of 2.79, and the upper layer 22 had the refractive index n of 2.13 and the extinction coefficient k of 0.28. Further, a front-surface reflectance (reflectance on the surface side of the phase shift film 2) of the phase shift film 2 with respect to light having a wavelength of 193 nm was 18.6%, whereas a back-surface reflectance (reflectance on the transparent substrate 1 side) thereof was 35.6%.

Through the above-mentioned procedure, there was produced the mask blank 100 according to Example 2 having the structure in which, on the transparent substrate 1, the phase shift film 2, which includes the lower layer 21 made of MoSiN and the upper layer 22 made of MoSiON, the light shielding film 3, and the hard mask film 4 are laminated.

[Manufacture of Phase Shift Mask]

Next, the phase shift mask 200 according to Example 2 was produced using the mask blank 100 according to Example 2 in the same procedure as that of Example 1.

The thus produced halftone-type shift mask 200 according to Example 2 was placed on the mask stage of the exposure apparatus using the ArF excimer laser as the exposure light. The ArF exposure light was radiated onto the phase shift mask 200 from the transparent substrate 1 side to transfer the pattern onto the resist film on the semiconductor device through the light exposure. Predetermined treatment was performed on the resist film after the exposure transfer to form the resist pattern. The resist pattern was observed with the scanning electron microscope (SEM). As a result, a positional shift amount from a design pattern was within an allowable range in all portions within a plane. Based on the result, it can be said that the circuit pattern can be formed with high accuracy on the semiconductor device by using the resist pattern as the mask.

Comparative Example 1

[Manufacture of Mask Blank]

A mask blank according to Comparative Example 1 was manufactured in the same procedure as that of Example 1 except for the phase shift film 2. As the phase shift film 2 according to Comparative Example 1, a film having a single-layer structure, which was made of molybdenum, silicon, nitrogen, and oxygen, was used. Specifically, the transparent substrate 1 was placed in the sheet-type DC sputtering apparatus. The phase shift film 2, which was made of molybdenum, silicon, nitrogen, and oxygen, was formed so as to have a thickness of 66 nm by the reactive sputtering (DC sputtering). In the reactive sputtering for forming the phase shift film 2, a mixed sintered target of molybdenum (Mo) and silicon (Si) (Mo:Si=4 atomic %:96 atomic %) was used, and a mixed gas of argon (Ar), nitrogen ($N_2$), oxygen ($O_2$), and helium (He) was used as a sputtering gas.

Further, under the same treatment conditions as those of Example 1, heat treatment was performed on the phase shift film 2. The phase shift film 2 according to Comparative Example 1, which was formed on a main surface of another transparent substrate 1 under the same conditions and had been subjected to heat treatment, was prepared. When the transmittance and the phase difference of the phase shift film 2 with respect to light having the wavelength of 193 nm were measured using the phase shift amount measurement apparatus (MPM193 manufactured by Lasertec Corporation), the transmittance was 12.1%, and the phase difference was 177.1° (deg). Moreover, when the phase shift film 2 was analyzed with the STEM and the EDX, it was confirmed that the oxidation layer was formed at a thickness of about 1.7 nm from the surface of the phase shift film 2. Further, when respective optical characteristics of the phase shift film 2 were measured, the refractive index n was 2.48 and the extinction coefficient k was 0.45.

Through the procedure described above, the mask blank according to Comparative Example 1 having the structure in which the phase shift film 2 made of MoSiON, the light shielding film 3, and the hard mask film 4 were laminated on the transparent substrate 1 was manufactured.

[Manufacture of Phase Shift Mask]

Next, the phase shift mask 200 according to Comparative Example 1 was produced using the mask blank according to Comparative Example 1 in the same procedure as that of Example 1.

The thus produced halftone-type phase shift mask 200 according to Comparative Example 1 was placed on the mask stage of the exposure apparatus using the ArF excimer laser as the exposure light. The ArF exposure light was radiated onto the phase shift mask 200 from the transparent substrate 1 side to transfer the pattern onto the resist film on the semiconductor device through light exposure. The predetermined treatment was performed on the resist film after the exposure transfer to form the resist pattern. The resist pattern was observed with the scanning electron microscope (SEM). As a result, a positional shift amount from a design pattern was large, and a large number of portions in which the positional shift amount exceeded the allowable range were found. Based on the result, it is predicted that disconnection and short-circuit occur in a circuit pattern to be formed on the semiconductor device using the resist pattern as the mask.

REFERENCE SIGNS LIST 1 transparent substrate
2 phase shift film
21 lower layer
22 upper layer
2a phase shift pattern
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank, comprising a phase shift film on a transparent substrate,
   the phase shift film having a function of transmitting exposure light from an ArF excimer laser at a transmittance of 2% or higher and 30% or lower and a function of generating a phase difference of 150° or larger and 180° or smaller between the exposure light that has been transmitted through the phase shift film and the exposure light that has passed through air by a distance equal to a thickness of the phase shift film,
   the phase shift film being formed of a material containing a metal and silicon and having a structure in which a lower layer and an upper layer are laminated in the stated order from the transparent substrate side,
   the lower layer having a refractive index n at a wavelength of the exposure light that is smaller than a refractive index n at the wavelength of the exposure light of the transparent substrate,
   the upper layer having a refractive index n at the wavelength of the exposure light that is larger than the refractive index n at the wavelength of the exposure light of the transparent substrate,
   the lower layer having an extinction coefficient k at the wavelength of the exposure light that is larger than an extinction coefficient k at the wavelength of the exposure light of the upper layer,
   the upper layer having a thickness that is larger than a thickness of the lower layer.

2. A mask blank according to claim 1, wherein the thickness of the lower layer is smaller than 10 nm.

3. A mask blank according to claim 1, wherein the thickness of the upper layer is 9 times or more larger than the thickness of the lower layer.

4. A mask blank according to claim 1, wherein the refractive index n of the lower layer is 1.5 or smaller.

5. A mask blank according to claim 1, wherein the refractive index n of the upper layer is 2.0 or larger.

6. A mask blank according to claim 1, wherein the extinction coefficient k of the lower layer is 2.0 or larger.

7. A mask blank according to claim 1, wherein the extinction coefficient k of the upper layer is 0.8 or smaller.

8. A mask blank according to claim 1,
   wherein the lower layer is formed of a material containing a metal and silicon, the material being substantially free from oxygen, and
   wherein the upper layer is formed of a material containing a metal, silicon, nitrogen, and oxygen.

9. A mask blank according to claim 1, wherein the mask blank has a back-surface reflectance of 20% or higher and 45% or lower with respect to the exposure light entering the mask blank from the transparent substrate side.

10. A mask blank according to claim 1, wherein the lower layer is formed in contact with a surface of the transparent substrate.

11. A mask blank according to claim 1, wherein the phase shift film has a thickness that is smaller than 100 nm.

12. A mask blank according to claim 1, wherein the upper layer has, as a surface layer, a layer having an oxygen content that is larger than an oxygen content of the upper layer excluding the surface layer.

13. A mask blank according to claim 1, further comprises a light shielding film formed on the phase shift film.

14. A method of manufacturing a phase shift mask using the mask blank of claim 13, the method comprising:
   forming a transfer pattern in the light shielding film by dry etching;
   forming a transfer pattern in the phase shift film by dry etching using the light shielding film having the transfer pattern as a mask; and
   forming a light shielding band pattern in the light shielding film by dry etching using a resist film having the light shielding band pattern as a mask.

15. A method of manufacturing a semiconductor device, comprising transferring a transfer pattern onto a resist film on a semiconductor device through light exposure through use of the phase shift mask manufactured by the method of manufacturing a phase shift mask of claim 14.

16. A phase shift mask, comprising a phase shift film having a transfer pattern formed therein, on a transparent substrate,
   the phase shift film having a function of transmitting exposure light from an ArF excimer laser at a transmittance of 2% or higher and 30% or lower and a function of generating a phase difference of 150° or larger and 180° or smaller between the exposure light that has been transmitted through the phase shift film and the exposure light that has passed through air by a distance equal to a thickness of the phase shift film,
   the phase shift film being formed of a material containing a metal and silicon and having a structure in which a lower layer and an upper layer are laminated in the stated order from the transparent substrate side,
   the lower layer having a refractive index n at a wavelength of the exposure light that is smaller than a refractive index n at the wavelength of the exposure light of the transparent substrate,
   the upper layer having a refractive index n at the wavelength of the exposure light that is larger than the refractive index n at the wavelength of the exposure light of the transparent substrate,
   the lower layer having an extinction coefficient k at the wavelength of the exposure light that is larger than an extinction coefficient k at the wavelength of the exposure light of the upper layer, the upper layer having a thickness that is larger than a thickness of the lower layer.

17. A phase shift mask according to claim 16, wherein the thickness of the lower layer is smaller than 10 nm.

18. A phase shift mask according to claim 16, wherein the thickness of the upper layer is 9 times or more larger than the thickness of the lower layer.

19. A phase shift mask according to claim 16, wherein the refractive index n of the lower layer is 1.5 or smaller.

20. A phase shift mask according to claim 16, wherein the refractive index n of the upper layer is 2.0 or larger.

21. A phase shift mask according to claim 16, wherein the extinction coefficient k of the lower layer is 2.0 or larger.

22. A phase shift mask according to claim 16, wherein the extinction coefficient k of the upper layer is 0.8 or smaller.

23. A phase shift mask according to claim 16, wherein the lower layer is formed of a material containing a metal and silicon, the material being substantially free from oxygen, and wherein the upper layer is formed of a material containing a metal, silicon, nitrogen, and oxygen.

24. A phase shift mask according to claim 16, wherein the phase shift mask has a back-surface reflectance of 20% or higher and 45% or lower with respect to the exposure light entering the phase shift mask from the transparent substrate side.

25. A phase shift mask according to claim 16, wherein the lower layer is formed in contact with a surface of the transparent substrate.

26. A phase shift mask according to claim 16, wherein the phase shift film has a thickness that is smaller than 100 nm.

27. A phase shift mask according to claim 16, wherein the upper layer has, as a surface layer, a layer having an oxygen content that is larger than an oxygen content of the upper layer excluding the surface layer.

28. A method of manufacturing a semiconductor device, comprising a step of transferring a transfer pattern onto a resist film on a semiconductor device through light exposure through use of the phase shift mask of claim 16.

* * * * *